United States Patent
Hartwell et al.

(10) Patent No.: US 6,600,201 B2
(45) Date of Patent: Jul. 29, 2003

(54) SYSTEMS WITH HIGH DENSITY PACKING OF MICROMACHINES

(75) Inventors: Peter G. Hartwell, Sunnyvale, CA (US); Robert G. Walmsley, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/923,000

(22) Filed: Aug. 3, 2001

(65) Prior Publication Data

US 2003/0025168 A1 Feb. 6, 2003

(51) Int. Cl.⁷ .............................................. H01L 29/82
(52) U.S. Cl. ...................... 257/415; 257/417; 257/499; 257/422; 438/52; 438/54
(58) Field of Search .................... 438/52, 54; 257/415, 257/417, 499, 622

(56) References Cited

U.S. PATENT DOCUMENTS 6,410,361 B2 * 6/2002 Dhuler et al. ............... 310/307

\* cited by examiner

*Primary Examiner*—Hoai Ho
*Assistant Examiner*—Mai-Huong Tran

(57) ABSTRACT

Micromachine systems are provided. An embodiment of such a micromachine system includes a substrate that defines a trench. First and second microelectromechanical devices are arranged at least partially within the trench. Each of the microelectromechanical devices incorporates a first portion that is configured to move relative to the substrate. Methods also are provided.

13 Claims, 4 Drawing Sheets

SYSTEMS WITH HIGH DENSITY PACKING OF MICROMACHINES

BACKGROUND OF THE INVENTION

Summary of the Invention

Briefly described, the present invention relates to micromachines. In this regard, embodiments of the invention may be construed as micromachine systems. An embodiment of such a micromachine system includes a substrate that defines a trench. First and second microelectromechanical devices are arranged at least partially within the trench. Each of the microelectromechanical devices incorporates a first portion that is configured to move relative to the substrate.

Other embodiments of the invention may be construed as methods for forming arrays of micromachines. In this regard, an embodiment includes the steps of providing a substrate and forming a trench in the substrate. First and second microelectromechanical devices are arranged at least partially within the trench. Each of the microelectromechanical devices includes a first portion that is configured to move relative to the substrate.

Other features and advantages of the present invention will become apparent to one with skill in the art upon examination of the following drawings and detailed description. It is intended that all such features and advantages be included herein within the scope of the present invention, as defined in the appended claims.

FIELD OF THE INVENTION

The present invention generally relates to micromachines and, more specifically, to systems and methods that provide high density packing of micromachines on a substrate.

DESCRIPTION OF THE RELATED ART

Micromachines, such as microelectromechanical system (MEMS) devices, are becoming prevalent in numerous applications. These devices are able to provide mechanical functionality on an extremely small scale. For example, a typical micromachine can be formed on the scale of tens of nanometers to millimeters.

Oftentimes, micromachines are formed on substrates, e.g., a semiconductor wafer. A single substrate can include hundreds of micromachines or more. The number of micromachines that are able to be provided per unit area of substrate, i.e., the packing density of the micromachines, is influenced by several factors. For example, the size of the micromachines and spacing provided between adjacent micromachines affect the packing density of the micromachines.

Since there is a seemingly perpetual desire to increase the packing density of micromachines, there is a need for systems and methods that address this and/or other desires.

DESCRIPTION OF THE DRAWINGS

The present invention, as defined in the claims, can be better understood with reference to the following drawings. The drawings are not necessarily to scale, emphasis instead being placed on clearly illustrating the principles of the present invention.

DETAILED DESCRIPTION OF THE INVENTION

Figure 1:
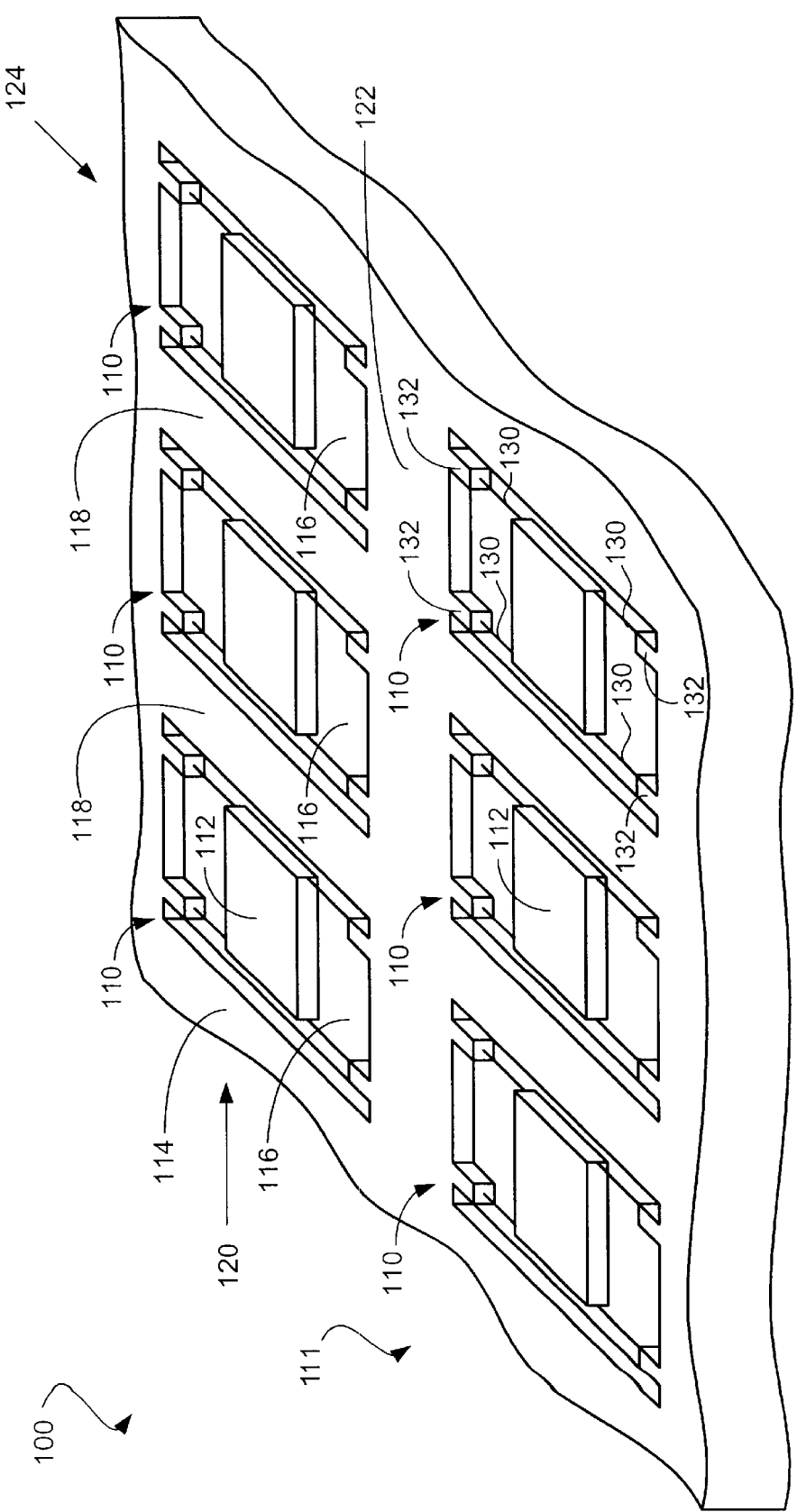
FIG. 1 is a schematic diagram depicting a portion of a substrate including a representative arrangement of micromachines.

Referring now to the figures wherein like reference numerals indicate corresponding components throughout the several views, FIG. 1 depicts an embodiment of a micromachine system 100. As described in greater detail hereinafter, embodiments of the micromachine system of the present invention can employ various techniques for providing high density packing of micromachines.

In FIG. 1, micromachine system 100 includes multiple micromachines 110 that are provided on a substrate 111. By way of example, substrate 111 can be a semiconductor wafer. Each micromachine 110 incorporates a micromover component ("micromover") 112. Micromovers 112 are adapted to move relative to at least a portion of substrate 111. In other embodiments of the invention, various types of micromachines other than micromovers can be used. However, in the description that follows, embodiments of the invention will be described with reference to micromovers. This is done merely for ease of description and not for the purpose of limitation.

Micromovers 112 preferably are spaced from each other so that adjacent micromovers 112 do not interfere with each other. More specifically, if adjacent micromovers were permitted to contact each other, either or both of the micromovers could be inhibited from performing their intended functions and/or could be damaged. Spacing between adjacent micromachines is accommodated by arranging each micromover within a corresponding trench 116. Preferably, each trench is defined by material of substrate 111. More specifically, the material of the substrate forms a longitudinal barrier 118 between adjacently disposed micromovers of a row 120 of micromovers. A transverse barrier 122 is formed between adjacently disposed micromovers of a column 124 of micromovers. Trenches 116 can be formed by either removing material of the substrate in the desired area of the trench, such as by etching, and/or by forming a raised area about the desired area of the trench, such as by deposition of material.

In the embodiment depicted of FIG. 1, micromovers 112 are substantially retained within their respective trenches by flexures 130. Multiple flexures 130 engage each micromover 112. The flexures tend to maintain a micromover within its trench while permitting the micromover to move, e.g., micromover 112 moves relative to substrate 111. Representative examples of flexures include springs and microfabricated beams.

Each flexure 130 is affixed to an anchor 132. Anchor 132 can be formed as a component affixed to the substrate or as a portion of the material of the substrate.

Micromachines can be fabricated by a variety of micromachining processes. In a typical process, the device material is silicon that is provided in the form of a wafer. The micromover, flexure, and anchor system are defined in the silicon wafer by a masking layer, which can be formed of a photoresist, for example. A deep silicon reactive ion etch may be used to transfer the mask shape into the silicon wafer. A typical etch depth may be 10 to 100 μm. The etch depth is often set by an etch-stop layer that is provided in the silicon wafer before micromachining fabrication is begun. The etch-stop layer can be formed of silicon dioxide, for example. The etch-stop layer is used as a sacrificial layer to facilitate the release of the micromover from the substrate. Release refers to a process by which constraints on the MEMS part, e.g., the micromover, are removed. This allows the micromover to move freely relative to the substrate. In the embodiment of FIG. 1, for example, flexures and anchors serve to constrain the motion of the released micromover to the desired degrees of freedom.

An isotropic etch of the sacrificial layer is performed to remove the sacrificial material from about the micromachine components in desired areas. The sacrificial layer may be 1 μm thick, for example. The duration of the etch step will determine which structures are released from the substrate. For instance, the longer the etch time, the more sacrificial material typically is removed during the etch. By removing more material during the etch, typically a larger structure, i.e., the structure defined in the masking step, can be released. Given sufficient time, the release etch can completely remove sacrificial material formed underneath a micromover and its flexures. In contrast, anchors are not released by the etch. To prevent release of the anchors, the anchors are formed sufficiently wide so that they are not undercut by the etch to a degree that permits release.

Figure 2:
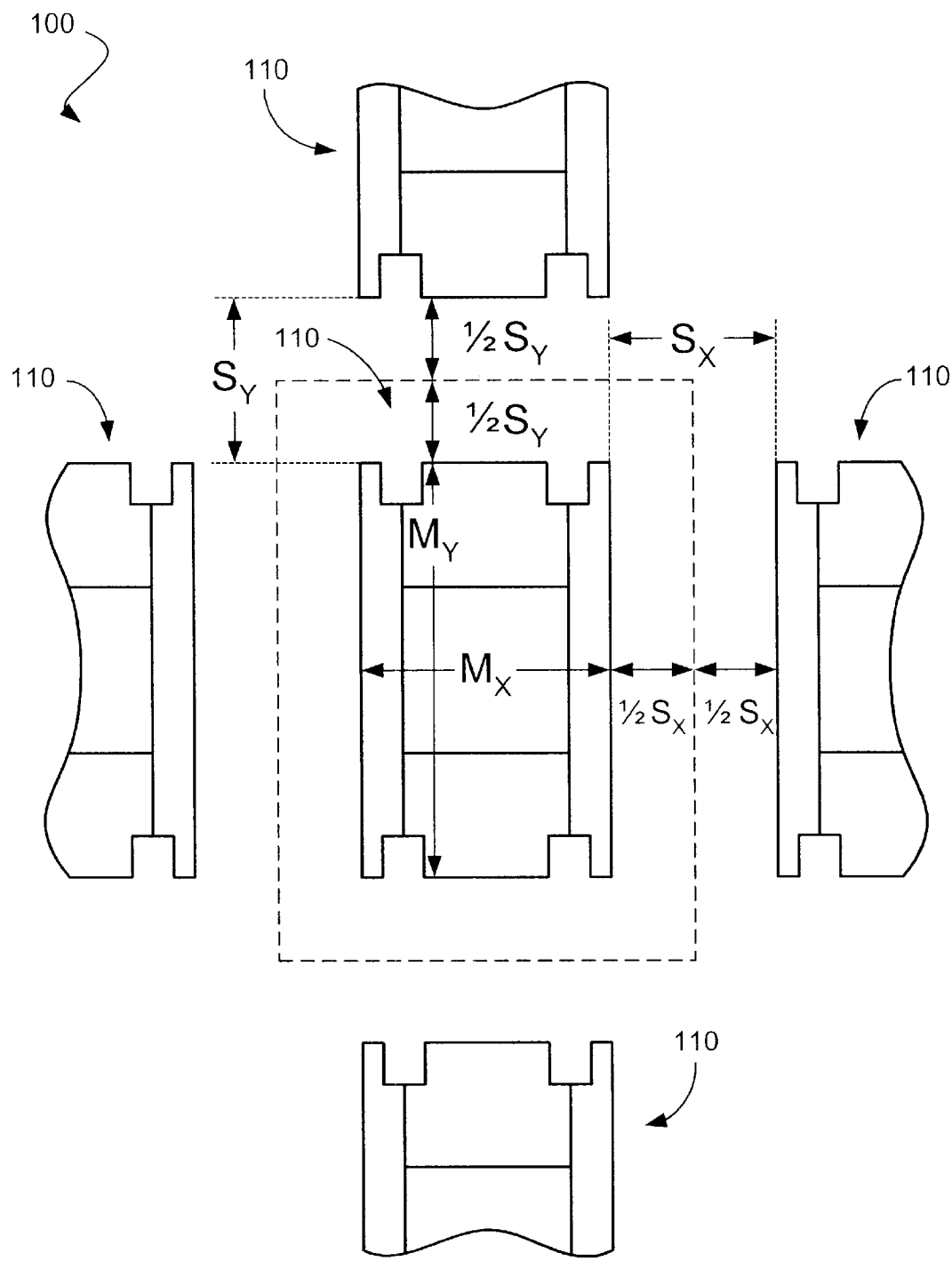
FIG. 2 is a schematic diagram depicting the micromachines of FIG. 1.

Referring now to FIG. 2, it is shown that several discrete dimensions affect the packing density of the micromachines 110, i.e., the number of micromachines per unit area. More specifically, each micromachine 110 exhibits a length (MX) and a width (MY), with MX and MY including both the dimensions of the physical device and its operating range. Each micromachine 110 is spaced from an adjacent micromachine by a length (SX), i.e., SX is the distance between adjacent micromachines of the same row, and a width (SY), i.e., SY is the distance between adjacent micromachines of the same column. Thus, in the embodiment depicted in FIG. 2, the total area associated with a micromachine 110 is defined by:

MX+(2)(½ SX), in the X dimension; and

MY+(2)(½ SY), in the Y dimension.

Figure 3:
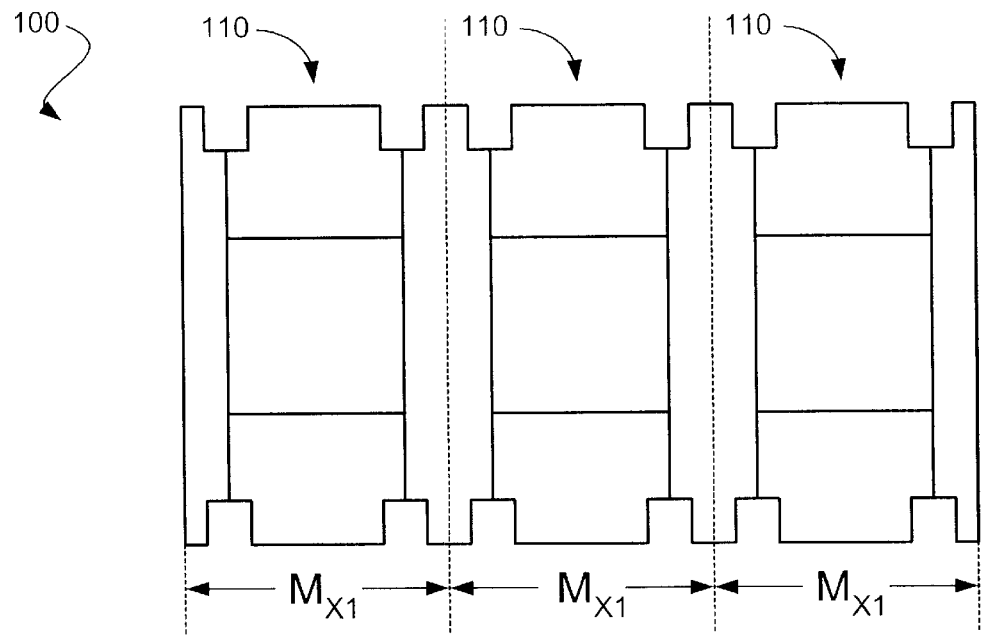
FIG. 3 is a schematic diagram depicting a representative arrangement of micromachines.

An alternative embodiment of micromachine system 100 is depicted in FIG. 3. As shown in FIG. 3, longitudinal barriers, which are shown in the embodiment of FIGS. 1 and 2, are not provided between adjacent micromovers 110. In this configuration, an increased packing density of the micromachines is achieved compared to the embodiment of FIGS. 1 and 2. More specifically, each micromachine 110 of FIG. 3 requires a length of MX1, i.e., in some embodiments, MX1<MX+(2)(½ SX).

Figure 4:
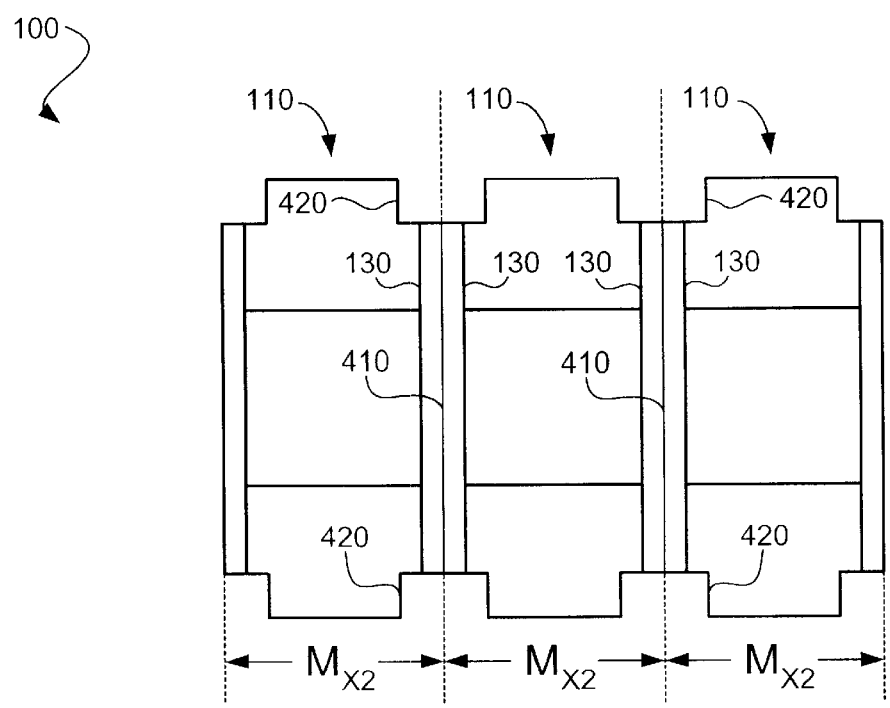
FIG. 4 is a schematic diagram depicting a representative arrangement of micromachines.

Another embodiment of micromachine system 100 is depicted in FIG. 4. As shown therein, separators 410 are provided between adjacently disposed micromachines. The separators 410 are adapted to prevent direct contact of adjacent micromovers. Preferably, each separator 410 is formed as a distinct component, i.e., the separator is not formed entirely of the material of the substrate. For example, separator 410 could be a micro-fabricated beam that is similar to that of flexure 130.

In FIG. 4, anchors 420 are used to secure multiple flexures 130. In particular, each anchor 420 is arranged between an adjacent pair of micromovers and is used to affix at least one flexure from each of the pair of micromovers. Each anchor 420 also can secure one or more separators 410. In embodiments incorporating anchors for fixing multiple components, such as flexures and/or separators, an increased packing density can be achieved. More specifically, in some embodiments, MX2<MX1<MX+(2)(½ SX).

Figure 5:
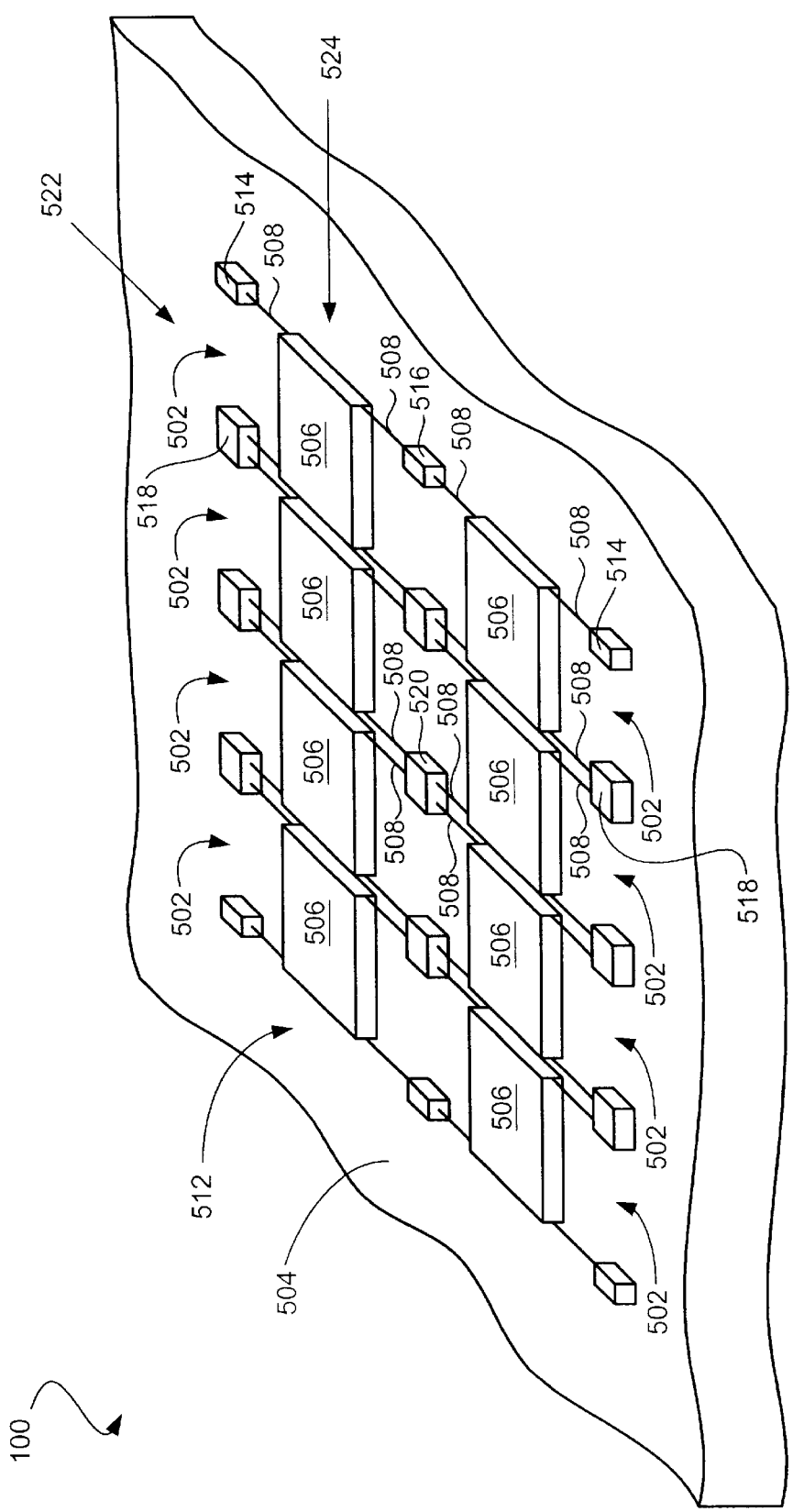
FIG. 5 is a schematic diagram depicting a portion of a substrate including an representative arrangement of micromachines.

In FIG. 5, micromachine system 100 includes multiple micromachines 502 that are provided on a substrate 504. Micromachines 502 preferably are spaced from each other so that adjacent micromovers 506 do not interfere with each other. Flexures 508 of the micromachines are affixed to anchors. The anchors, being raised from a surface 510 of the substrate, define a trench 512 that is arranged about the anchors.

In FIG. 5, four types of anchors are depicted, i.e., anchors 514, 516, 518 and 520. More specifically, anchors 514 are adapted to affix a flexure from a single micromover. Typically, such a micromover is arranged at a corner of the array of micromachines. In regard to anchors 516, these anchors are adapted to affix flexures from at least two micromachines. Since micromachine system 100 of FIG. 5 includes columns 522 of micromachines, anchors 516 typically are provided only along the outer edge of a column of micromachines.

Anchors 518 also are adapted to affix flexures from at least two micromovers. Anchors 518 typically are provided only along the outer edge of a row 524 of micromachines. Similar to anchors 516, anchors 518 are adapted to affix flexures from at least two micromachines. However, unlike anchors 516, each of which engages flexures on opposing sides of the anchor, each anchor 518 typically engages the flexures along one side of the anchor.

Anchors 520 typically are provided at locations other than the outer periphery of an array of micromachines. As shown in FIG. 5, anchors 520 are adapted to affix flexures from at least four micromovers. In particular, one side of an anchor is adapted to affix flexures of adjacently disposed micromovers of a first row, and the other side of the anchor is adapted to affix flexures of adjacently disposed micromovers of a second row.

Although not shown in FIG. 5, separators also can be provided between at least some of the adjacently disposed micromovers of the micromachine system 100 depicted therein.

The foregoing description has been presented for purposes of illustration and description. It is not intended to be exhaustive or to limit the invention to the precise forms disclosed. Modifications or variations are possible in light of the above teachings. The embodiment or embodiments discussed, however, were chosen and described to provide the best illustration of the principles of the invention and its practical application to thereby enable one of ordinary skill in the art to utilize the invention in various embodiments and with various modifications as are suited to the particular use contemplated.

For example, spacing between adjacently disposed micromachines may not be required for micromachines that are intended to move together. In these embodiments, a further increase in packing density can be achieved by configuring these micromachines so that they engage each other. All such modifications and variations are within the scope of the invention as determined by the appended claims when interpreted in accordance with the breadth to which they are fairly and legally entitled.

What is claimed is:

1. A micromachine system comprising:

a substrate defining a trench;

a first microelectromechanical device arranged at least partially within said trench, said first microelectromechanical device including a first portion, said first portion being configured to move relative to said substrate; and a second microelectromechanical device arranged at least partially within said trench and adjacent to said first microelectromechanical device, said second microelectromechanical device including a first portion, said first portion being configured to move relative to said substrate.

2. The micromachine system of claim 1, further comprising:
   a first anchor fixed in position relative to said substrate, said first anchor being configured to maintain said first portion of said first microelectromechanical device at least partially within said trench; and
   a second anchor fixed in position relative to said substrate, said second anchor being configured to maintain said first portion of said second microelectromechanical device at least partially within said trench.

3. The micromachine system of claim 1, further comprising:
   means for maintaining said first portion of said first microelectromechanical device at least partially within said trench; and
   means for maintaining said first portion of said second microelectromechanical device at least partially within said trench.

4. The micromachine system of claim 1, wherein said first portion of said first microelectromechanical device and said first portion of said second microelectromechanical device are configured to move independently of each other.

5. The micromachine system of claim 1, further comprising:
   a separator disposed at least partially between said first microelectromechanical device and said second microelectromechanical device, said separator being adapted to prevent said first microelectromechanical device from contacting said second microelectromechanical device.

6. The micromachine system of claim 1, further comprising:
   means for preventing said first microelectromechanical device from contacting said second microelectromechanical device.

7. The micromachine system of claim 2, wherein:
   said first microelectromechanical device includes a first flexure, said first flexure having a first end affixed to said first anchor, said first flexure being affixed to said first portion of said first microelectromechanical device, said first flexure being adapted to deform such that said first portion of said first microelectromechanical device is capable of moving relative to said substrate; and
   said second microelectromechanical device includes a first flexure, said first flexure of said second microelectromechanical device having a first end affixed to said second anchor, said first flexure of said second microelectromechanical device being affixed to said first portion of said second microelectromechanical device, said first flexure of said second microelectromechanical device being adapted to deform such that said first portion of said second microelectromechanical device is capable of moving relative to said substrate.

8. The micromachine system of claim 5, wherein said separator is a micro-fabricated beam.

9. The micromachine system of claim 7, wherein said first microelectromechanical device includes a second flexure, said second flexure having a first end affixed to said second anchor, said second flexure being affixed to said first portion of said first microelectromechanical device; and
   wherein said second microelectromechanical device includes a second flexure, said second flexure of said second microelectromechanical device having a first end affixed to said first anchor, said second flexure of said second microelectromechanical device being affixed to said first portion of said second microelectromechanical device.

10. The micromachine system of claim 7, further comprising:
    a third microelectromechanical device arranged at least partially within said trench, said third microelectromechanical device including a first portion and a first flexure, said first portion of said third microelectromechanical device being configured to move relative to said substrate, said first flexure of said third microelectromechanical device having a first end affixed to said first anchor, said first flexure of said third microelectromechanical device being affixed to said first portion of said third microelectromechanical device, said first flexure of said third microelectromechanical device being adapted to deform such that said first portion of said third microelectromechanical device is capable of moving relative to said substrate.

11. The micromachine system of claim 8, further comprising:
    a separator disposed at least partially between said first microelectromechanical device and said second microelectromechanical device, said separator being adapted to prevent said first microelectromechanical device from contacting said second microelectromechanical device, said separator being adapted to deform in response to contact by said first portion of said first microelectromechanical device and said first portion of said second microelectromechanical device.

12. The micromachine system of claim 8, wherein said first flexure of said first microelectromechanical device and said first flexure of said second microelectromechanical device are micro-fabricated beams.

13. The micromachine system of claim 10, further comprising:
    a fourth microelectromechanical device arranged at least partially within said trench, said fourth microelectromechanical device including a first portion and a first flexure, said first portion of said fourth microelectromechanical device being configured to move relative to said substrate, said first flexure of said fourth microelectromechanical device having a first end affixed to said first anchor, said first flexure of said fourth microelectromechanical device being affixed to said first portion of said fourth microelectromechanical device, said first flexure of said fourth microelectromechanical device being adapted to deform such that said first portion of said fourth microelectromechanical device is capable of moving relative to said substrate.

* * * * *